(12) United States Patent
Lee et al.

(10) Patent No.: US 8,497,627 B2
(45) Date of Patent: Jul. 30, 2013

(54) DISPLAY DEVICE AND ORGANIC LIGHT EMITTING DIODE DISPLAY

(75) Inventors: Hae-Yeon Lee, Yongin (KR); Wang-Jo Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 28 days.

(21) Appl. No.: 13/183,325

(22) Filed: Jul. 14, 2011

(65) Prior Publication Data

US 2012/0153814 A1 Jun. 21, 2012

(30) Foreign Application Priority Data

Dec. 17, 2010 (KR) .......................... 10-2010-0129984

(51) Int. Cl.
*H01J 1/62* (2006.01)
*H01J 63/04* (2006.01)

(52) U.S. Cl.
USPC ........... 313/504; 313/483; 313/500; 313/501; 313/502; 313/503; 313/505; 313/506; 313/512

(58) Field of Classification Search
None
See application file for complete search history.

(56) References Cited

U.S. PATENT DOCUMENTS

| | | | | |
|---|---|---|---|---|
| 7,132,154 B2* | 11/2006 | Shibahara et al. | ......... | 428/297.4 |
| 7,511,295 B2* | 3/2009 | Kim et al. | ........................ | 257/40 |
| 8,198,796 B2* | 6/2012 | Takada | ........................ | 313/352 |
| 8,264,144 B2* | 9/2012 | Oikawa et al. | ................. | 313/512 |
| 2004/0132867 A1* | 7/2004 | Shibahara et al. | ............. | 523/466 |
| 2007/0092709 A1* | 4/2007 | Okamoto et al. | .......... | 428/297.4 |
| 2008/0143247 A1* | 6/2008 | Kim et al. | ...................... | 313/504 |
| 2010/0013372 A1* | 1/2010 | Oikawa et al. | ................. | 313/498 |
| 2012/0025700 A1* | 2/2012 | Ryu et al. | ....................... | 313/512 |

FOREIGN PATENT DOCUMENTS

| | | | |
|---|---|---|---|
| JP | 2001-052858 A | | 2/2001 |
| JP | 2003-332048 A | | 11/2003 |
| KR | 10-2006-0089977 A | | 8/2006 |

* cited by examiner

*Primary Examiner* — Natalie Walford
(74) *Attorney, Agent, or Firm* — Knobbe Martens Olson & Bear, LLP

(57) ABSTRACT

A display device includes: a substrate; a display unit that is formed over the substrate; a driving driver positioned outside the display unit and including a plurality of signal lines; a sealing substrate fixed to the substrate by a bonding layer surrounding the display unit and the driving driver. The sealing layer includes a composite member including a resin matrix and a plurality of carbon fibers and a first metal layer positioned over the composite member. The display device further includes a plurality of pads positioned outside the bonding layer and electrically connected to the plurality of signal lines; and a plurality of second metal layers positioned over one surface of the composite member facing the plurality of pads and connected to the plurality of pads, respectively, through a conductive bonding layer.

24 Claims, 15 Drawing Sheets

DISPLAY DEVICE AND ORGANIC LIGHT EMITTING DIODE DISPLAY

RELATED APPLICATIONS

This application claims priority to and the benefit of Korean Patent Application No. 10-2010-0129984 filed in the Korean Intellectual Property Office on Dec. 17, 2010, the entire contents of which are incorporated herein by reference.

BACKGROUND

1. Field

The present disclosure relates generally to a display device. More particularly, the present disclosure relates generally to an organic light emitting diode (OLED) display.

2. Description of the Related Technology

A display device includes a flat panel type and self-luminant type OLED display.

The organic light emitting diode (OLED) display has a self-luminant organic light emitting element to display an image. When a display unit including a plurality of organic light emitting elements is exposed to moisture and oxygen, a function thereof is deteriorated and thus technology of blocking penetration of external moisture and oxygen by sealing the display unit is requested.

A driving driver including a plurality of signal lines can be positioned on a substrate at the outside of the display unit. In this case, as the size of a display device increases, wiring resistance of signal lines increases and thus signal transmission delay (RC delay) occurs, whereby luminance uniformity of a screen is deteriorated.

The above information disclosed in this Background section is only for enhancement of understanding of the background of the described technology and therefore it may contain information that does not form the prior art that is already known in this country to a person of ordinary skill in the art.

SUMMARY

One aspect of the invention provides a display device and an organic light emitting diode (OLED) display having advantages of improving a sealing function of a display unit and suppressing RC delay by reducing resistance of driving driver signal lines.

An embodiment provides a display device including: a substrate; a display unit disposed over the substrate; a driving driver disposed outside the display unit, the driving driver comprising a plurality of signal lines; a sealing substrate fixed to the substrate by a bonding layer enclosing the display unit and the driving driver, wherein the sealing substrate comprises a composite member comprising a resin matrix and a plurality of carbon fibers, and a first metal layer disposing at one surface of the composite member; a plurality of pads disposed outside the bonding layer and electrically connected to the plurality of signal lines, respectively, through an extension wire; and a plurality of second metal layers disposed at one surface of the composite member facing the plurality of pads and electrically connected to the plurality of pads, respectively, through a electrically conductive bonding layer.

The display device may further include an insulating layer disposed between the composite member and the first metal layer and between the composite member and the second metal layers. The extension wire may be provided in plural at a predetermined distance from each other in a length direction of each of the plurality of signal lines.

The plurality of second metal layers may be provided with the same quantity as that of the plurality of pads and be disposed at the same position as that of a corresponding pad when viewed in a thickness direction of the substrate. The conductive bonding layer may be conductive in the thickness direction and may have an insulating property in a direction other than the thickness direction.

The composite member may have a plurality of penetration holes, and a plurality of third metal layers may be filled in the plurality of penetration holes and be disposed at an outer surface of the composite member. The second metal layer and the third metal layer may contact with one to one. The display device may further include an insulating layer that is formed directly on an inner surface of the composite member, a side wall of the penetration hole, and an outer surface of the composite member.

The first metal layer may be opposite to the display unit and the driving driver and be formed in a size that contacts with the bonding layer, and the plurality of second metal layers may be positioned at a predetermined distance from the first metal layer and outside the first metal layer. The first metal layer and the plurality of second metal layers may be formed with one of a copper film, an aluminum film, copper foil, and aluminum foil.

The driving driver may be a scan driver and be disposed at both sides of the display unit.

Another embodiment provides an organic light emitting diode (OLED) display including: a substrate; a display unit disposed over the substrate, the display unit comprises a common power source line and a common electrode; a driving driver disposed outside the display unit, the driving driver comprises a plurality of signal lines; a sealing substrate fixed to the substrate by a bonding layer enclosing the display unit and the driving driver, the sealing substrate comprises a resin matrix and a plurality of carbon fibers, and has a penetration hole; a plurality of first pads disposed outside the bonding layer and electrically connected to the plurality of signal lines, respectively, through an extension wire; a plurality of metal layers disposed at one surface of the sealing substrate toward the plurality of pads and electrically connected to the plurality of first pads, respectively, through a conductive bonding layer; and a conductive portion disposed over an inner surface and an outer surface of the sealing substrate through the penetration hole, the conductive portion supplies an electric signal to one of the common power source line and the common electrode.

The extension wire may be provided in plural at a predetermined distance from each other in a length direction of each of the plurality of signal lines. The plurality of metal layers may be provided with the same quantity as that of the plurality of first pads and be disposed at the same position as that of a corresponding first pad when viewed in a thickness direction of the substrate.

The conductive bonding layer may be electrically conductive in the thickness direction and may have an electrically insulating property in a direction other than the thickness direction. The driving driver may be a scan driver and be positioned at both sides of the display unit.

The sealing substrate may have a first penetration hole and a second penetration hole. The conductive portion may include a first conductive portion that is disposed over an inner surface and an outer surface of the sealing substrate through the first penetration hole and that supplies a first electric signal to the common power source line; and a second conductive portion that is disposed over an inner surface and an outer surface of the sealing substrate through the second penetration hole and that supplies a second electric signal to the common electrode.

The OLED display may further include a plurality of second pads electrically connected to the common power source line, and a plurality of third pads electrically connected to the common electrode. The second pads and third pads may be disposed outside the bonding layer. The conductive bonding layer may be disposed between the second pad and the first conductive portion, and between the third pad and the second conductive portion.

The first conductive portion may include a first inner layer that is disposed at an inner surface of the sealing substrate and that contacts with the conductive bonding layer; a first connection portion that contacts with the first inner layer and that is filled in the first penetration hole; and a first outer layer that contacts with the first connection portion and that is disposed at an outer surface of the sealing substrate.

The second conductive portion may include a second inner layer that is disposed over an inner surface of the sealing substrate and that contacts with the conductive bonding layer; a second connection portion that contacts with the second inner layer and that is filled in the second penetration hole; and a second outer layer that contacts with the second connection portion and that is disposed over an outer surface of the sealing substrate.

The OLED display may further include an insulating layer that is formed over an inner surface of the sealing substrate, a side wall of the first penetration hole and the second penetration hole, and directly on an outer surface of the sealing substrate.

The second inner layer may include a central portion that faces the display unit and the driving driver and contacts with the bonding layer, and a plurality of extension portions that contact with the conductive bonding layer. The first inner layer and the plurality of metal layers may be disposed at a predetermined distance from the central portion and outside the central portion.

The plurality of carbon fibers may be arranged to intersect each other within the resin matrix. Alternatively, the sealing substrate may be formed with a plurality of layers, and each of the plurality of layers may include a plurality of carbon fibers that are arranged in one direction with the resin matrix. A plurality of carbon fibers that are arranged in one layer of the plurality of layers and a plurality of carbon fibers that are arranged in another one layer thereof may intersect each other.

The foregoing display device and the foregoing OLED display can improve a sealing function of a display unit, and can minimize a bending problem caused by thermal expansion coefficient differences when bonding a substrate and a sealing substrate. Further, while a display unit with a large size is embodied, RC delay of driving driver signal lines can be prevented and by omitting a flexible printed circuit board (FPC), an entire structure and a manufacturing process of the display device can be simplified.

DETAILED DESCRIPTION

Figure 1:
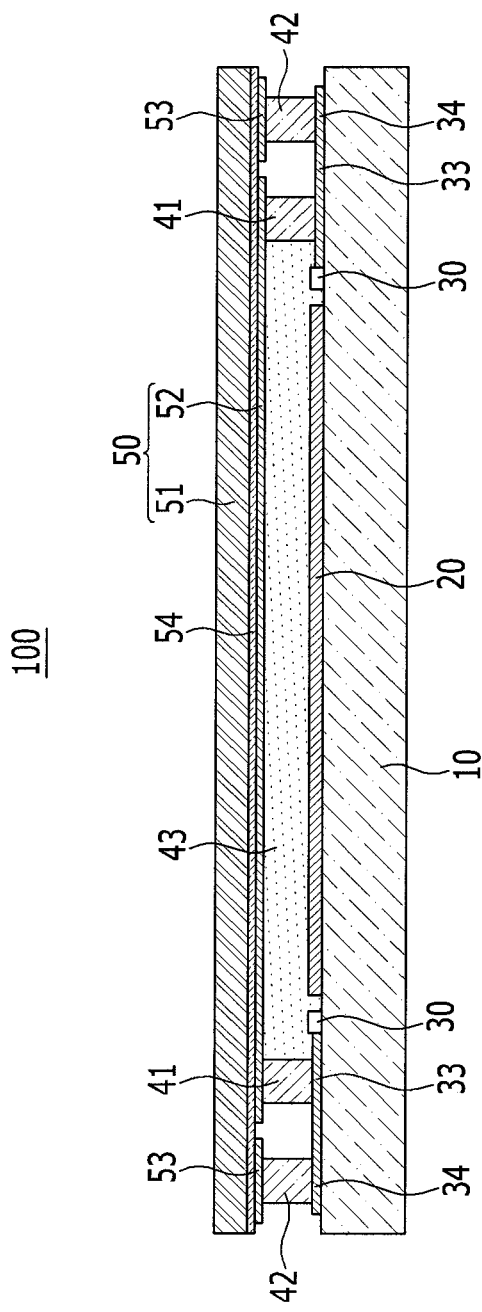
FIG. 1 is a cross-sectional view illustrating an OLED display according to a first embodiment.

Embodiments of the present invention will be described more fully hereinafter with reference to the accompanying drawings, in which embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification. Further, in the drawings, a size and thickness of each element are randomly represented for better understanding and ease of description, and the present invention is not limited thereto.

In the entire specification, when it is said that any part, such as a layer, film, region, or plate, is positioned on another part, it means the part is directly on the other part or above the other part with at least one intermediate part. Throughout this specification and the claims that follow, when it is described that an element is "coupled" to another element, the element may be "directly coupled" to the other element or "electrically coupled" to the other element through a third element. Additionally, when a member is described "conductive", it may be electrically conductive.

Figure 2:
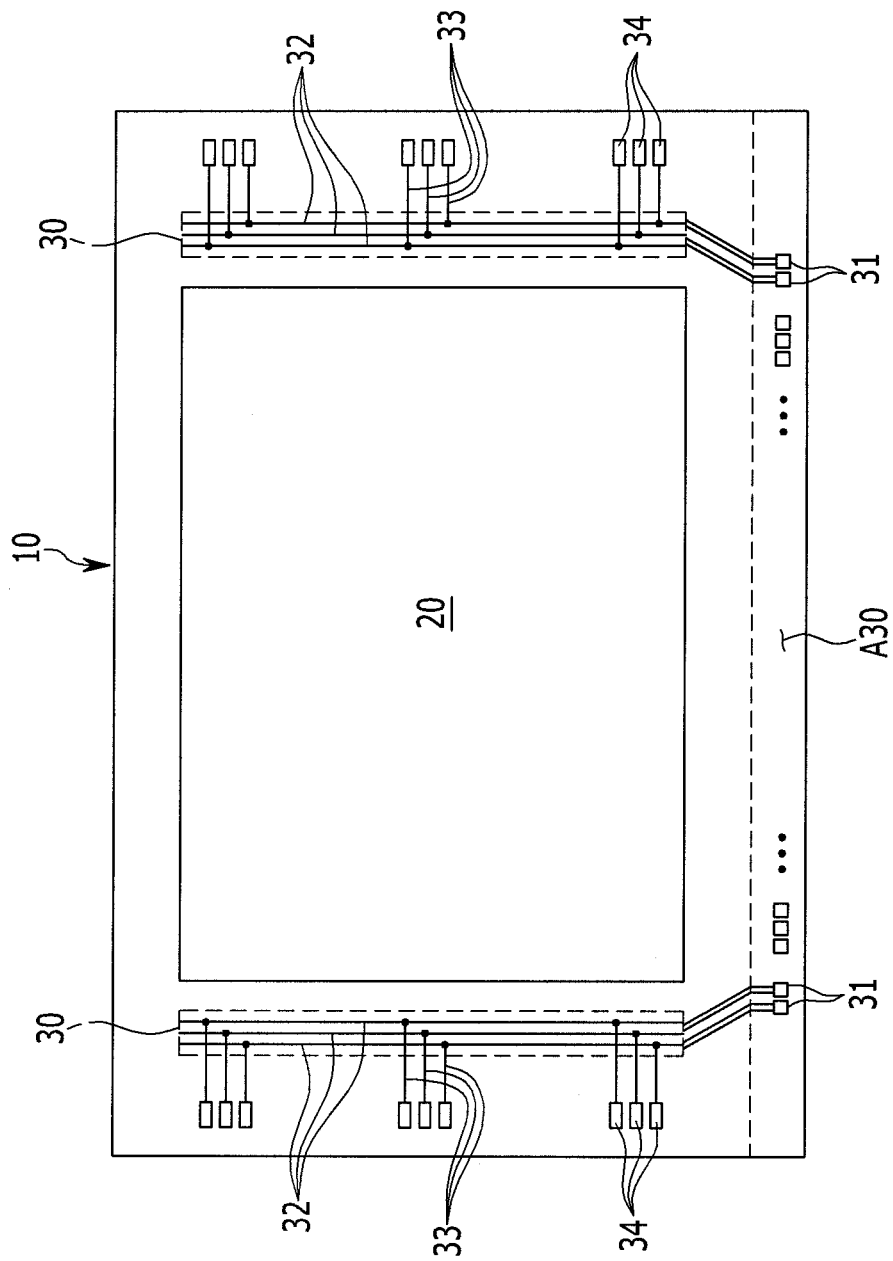
FIG. 2 is a top plan view illustrating a substrate of the OLED display that is shown in FIG. 1.
Figure 3:
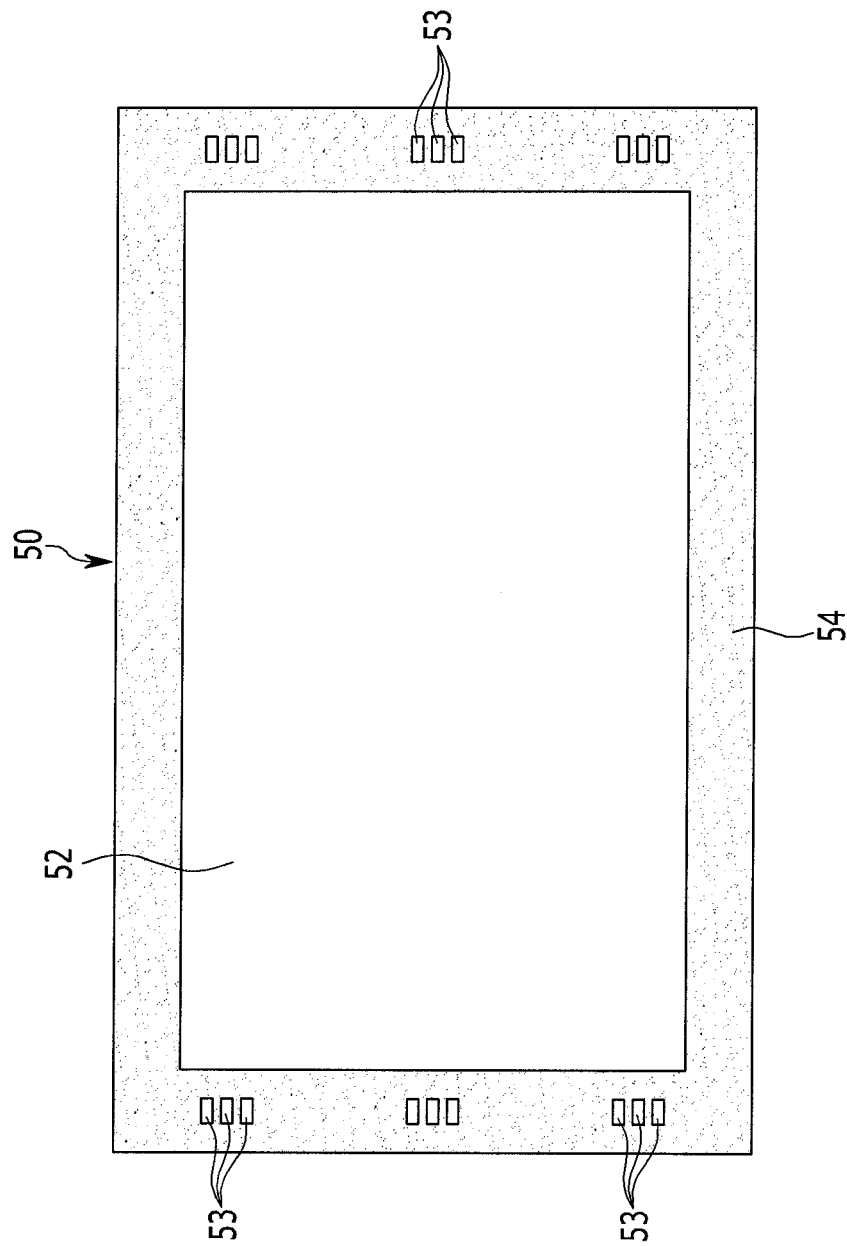
FIG. 3 is a top plan view illustrating an inner surface of a sealing substrate of the OLED display that is shown in FIG. 1.

FIG. 1 is a cross-sectional view illustrating an OLED display according to a first embodiment, and FIGS. 2 and 3 are top plan views illustrating a substrate and an inner surface of a sealing substrate of the OLED display that is shown in FIG. 1.

Referring to FIGS. 1 to 3, an OLED display 100 according to the first embodiment includes a substrate 10, a display unit 20 that is formed on the substrate 10, a driving driver 30 that is positioned outside the display unit 20, and a sealing substrate 50 that is fixed to the substrate 10 by a bonding layer 41 that encloses the display unit 20 and the driving driver 30.

The display unit 20 includes a plurality of pixels, and each pixel has an organic light emitting element and a driving circuit that controls the organic light emitting element. For convenience, FIG. 1 schematically illustrates the display unit 20 that is formed in one layer.

The substrate 10 is formed with transparent glass or transparent plastic, and light that is emitted from the display unit 20 transmits the substrate 10 and is emitted to the outside. In this case, at the substrate 10, because many electric wires are positioned outside the display unit 20 at which the bonding layer 41 is positioned, light transmittance is not high. Therefore, the bonding layer 41 may be formed with a thermosetting resin instead of an ultraviolet (UV) curable resin and may include an epoxy resin.

In some embodiments, a moisture absorption filling material 43 is positioned between the substrate 10 and the sealing substrate 50 toward the inside of the bonding layer 41, and a getter (not shown) is positioned between the display unit 20 and the bonding layer 41. Because the substrate 10 should be subject dozens of heat treatment processes of forming a driving circuit and an organic light emitting element on the substrate 10, the substrate 10 is formed with glass or plastic having a small thermal expansion coefficient. A thermal expansion coefficient of the substrate 10 may be about $3\times 10^{-6}$ K to about $4\times 10^{-6}$ K.

The sealing substrate 50 includes a composite member 51 including a resin matrix and a plurality of carbon fibers and a first metal layer 52 that is positioned at one surface of the composite member 51 toward the substrate 10. The first metal layer 52 is opposite to the display unit 20 and the driving driver 30 and is formed in a size that contacts with the bonding layer 41. A plurality of carbon fibers in the composite member 51 are formed in a structure that is impregnated into a resin matrix. A detailed structure of the composite member 51 will be described later.

A thermal expansion coefficient of a carbon fiber of the composite member 51 is lower than that of the substrate 10, and a thermal expansion coefficient of a resin matrix is higher than that of the substrate 10. Particularly, a thermal expansion coefficient according to a length direction of a carbon fiber has a negative (−) value. By appropriately adjusting a content of a resin matrix and a content of a carbon fiber, the composite member 51 can have a thermal expansion coefficient extremely similar to that of the substrate 10.

Therefore, when bonding the substrate 10 and the sealing substrate 50 by curing the bonding layer 41 in a high temperature, a bending problem due to a thermal expansion coefficient difference between the substrate 10 and the sealing substrate 50 does not occur, after the substrate 10 and the sealing substrate 50 are bonded, and a bending problem does not occur in an environment reliability test.

In some embodiments, the first metal layer 52 may be formed with an aluminum film or a copper film or may be formed with metal foil including aluminum or copper.

The first metal layer 52 is very excellent in an effect that blocks external moisture and oxygen. Thereby, external moisture and oxygen of the OLED display 100 is firstly blocked by the composite member 51 having a dense structure, is secondly blocked by the first metal layer 52, and is thirdly blocked by the moisture absorption filling material 43. The sealing substrate 50 that is formed with the first metal layer 52 and the composite member 51 can embody high airtightness of the same level as that of a glass substrate.

As a result, the OLED display 100 according to the first embodiment prevents performance degradation of the display unit 20 by improving a sealing function of the display unit 20 and can increase a use life-span.

In the above-described OLED display 100, the driving driver 30 is a built-in type and is positioned at the inside of the bonding layer 41 on the substrate 10. The driving driver 30 is formed with a scan driver or a data driver. In FIG. 2, a configuration that a pair of scan drivers are positioned at the left side and the right side of the display unit 20 is illustrated as an example, but a kind, a position, and the quantity of the driving driver 30 are not limited to the illustrated example.

In the display unit 20, a plurality of gate lines and a plurality of data lines are formed to intersect. A driving circuit and an organic light emitting element are positioned at each pixel at which the gate line and the data line intersect. The driving circuit includes at least one capacitor and at least two thin film transistors including a switching thin film transistor and a driving thin film transistor. The organic light emitting element includes a pixel electrode, an organic emission layer, and a common electrode.

Further, a common power source line is positioned at the display unit 20. The common power source line may include an intersecting first common power source line and second common power source line. The gate line is electrically connected to the scan driver to transfer a scan signal, and the data line is electrically connected to a data driver (not shown) to transfer a data signal. The common power source line applies a common voltage to the driving thin film transistor.

A pad area A30 is positioned at one side edge of the substrate 10, and pad electrodes that are electrically connected to various lines constituting the display unit 20 are formed in the pad area A30. The driving driver 30 is also electrically connected to the pad electrodes 31 that are positioned at the pad area A30 and receives a control signal from a chip on film (COF) (not shown) that is attached to the pad area A30.

The driving driver 30 includes a plurality of signal lines 32. In FIG. 2, in embodiments, the driving driver 30 is a scan driver. Also, a configuration that three signal lines 32 are positioned at one scan driver is illustrated as an example, but the quantity of the signal lines 32 is not limited to the illustrated example. A signal that is applied to the scan driver may include a start signal, a plurality of clock signals, and a control signal, and the quantity of the signal lines 32 corresponds in one-to-one to the kind of these signals. Each gate line is connected to the plurality of signal line 32.

As the OLED display 100 is formed in a large area, a length of the signal line 32 increases and thus wiring resistance increases. Thereby, RC (resistance×capacitance) delay occurs and thus luminance uniformity of a screen may be deteriorated. In the OLED display 100 according to the first embodiment, at least one extension wire 33 is connected to each of the plurality of signal line 32 to be withdrawn to the outside of the bonding layer 41, and a pad 34 is formed in an end portion of the extension wire 33.

In FIG. 2, a configuration that three extension wires 33 are connected to each of a plurality of signal lines 32 at an upper position, an intermediate position, and a low position of the substrate 10 and thus with respect to one scan driver, a total of 9 (nine) pads 34 are formed outside the bonding layer 41 is illustrated as an example. However, forming positions and the quantity of the extension wire 33 and the pad 34 that are connected to each signal line 32 are not limited to the illustrated example and can be variously changed.

At one surface of the composite member 51 that is opposite to the pad 34 in a thickness direction (a vertical direction of FIG. 1) of the OLED display 100, a second metal layer 53 is formed. The second metal layer 53 is positioned at a predetermined distance from the first metal layer 52 outside the first metal layer 52. The quantity of the second metal layer 53 is equal to that of the pad 34, and a position of the second metal layer 53 corresponds in one-to-one to that of the pad 34. A conductive bonding layer 42 is positioned between the pad 34 and the second metal layer 53 to electrically connect the pad 34 and the second metal layer 53.

In embodiments, the conductive bonding layer 42 provides electric conductivity only in a thickness direction and does not have electric conductivity in other directions. Therefore, the conductive bonding layer 42 electrically connects only one pad 34 and one second metal layer 53 that are opposite to each other in a thickness direction. As a result, even if one conductive bonding layer 42 contacts with a plurality of pads 34 and a plurality of second metal layers 53, the plurality of pads 34 and a plurality of second metal layers 53 that are positioned parallel are not short-circuited from each other.

The second metal layer 53 may be formed with the same copper film or aluminum film as that of the first metal layer 52, or may be formed with metal foil including copper or aluminum. The second metal layer 53 has very low electrical resistance, and each signal line 32 is coupled in parallel to the plurality of second metal layers 53 through the pad 34 and the conductive bonding layer 42. Therefore, even if each signal line 32 is formed in a large length to correspond to the large area display unit 20, wiring resistance surely decreases by the second metal layers 53 and thus RC delay can be effectively prevented.

In some embodiments, because the composite member 51 including a carbon fiber is a conductor, when directly forming the second metal layers 53 on the composite member 51, the second metal layers 53 are short-circuited from each other. In order to minimize this problem, an insulating layer 54 is formed at one surface of the composite member 51 toward the substrate 10, and the first metal layer 52 and the second metal layers 53 are formed on the insulating layer 54. Accordingly, the first metal layer 52 and the second metal layers 53 are insulated, and the second metal layers 53 are insulated from each other.

In this way, as the OLED display 100 according to the first embodiment can minimize RC delay of the signal lines 32 of the driving driver 30 using the second metal layers 53 of the sealing substrate 50 while embodying the large area display unit 20. Therefore, the OLED display 100 according to the first embodiment can increase luminance uniformity of the large area display unit 20 even without forming a pad area A30 at four edges of the right side, the left side, the upper side, and the lower side of the substrate 10.

In one example, a plurality of flexible printed circuits (FPC) are mounted to the edge of the substrate 10 in a length direction of the signal lines 32 of the driving driver 30, and an electric signal was applied to the signal lines 32 of the driving driver 30 through the plurality of FPCs.

In this example, because the pad area A30 is formed at four edges of the right side, the left side, the upper side, and the lower side of the substrate 10, dead space of the OLED display is enlarged, and as the plurality of FPCs are attached to the pad area A30 of four locations, an entire structure of the OLED display becomes complicated. Further, a production time increases due to a bonding process of the FPC, and a production cost increases due to a FPC Cost.

However, because the OLED display 100 according to the first embodiment may omit the FPC for minimizing RC delay, an entire structure and a manufacturing process of the OLED display 100 can be simplified and a production cost thereof can be lowered.

Figure 4:
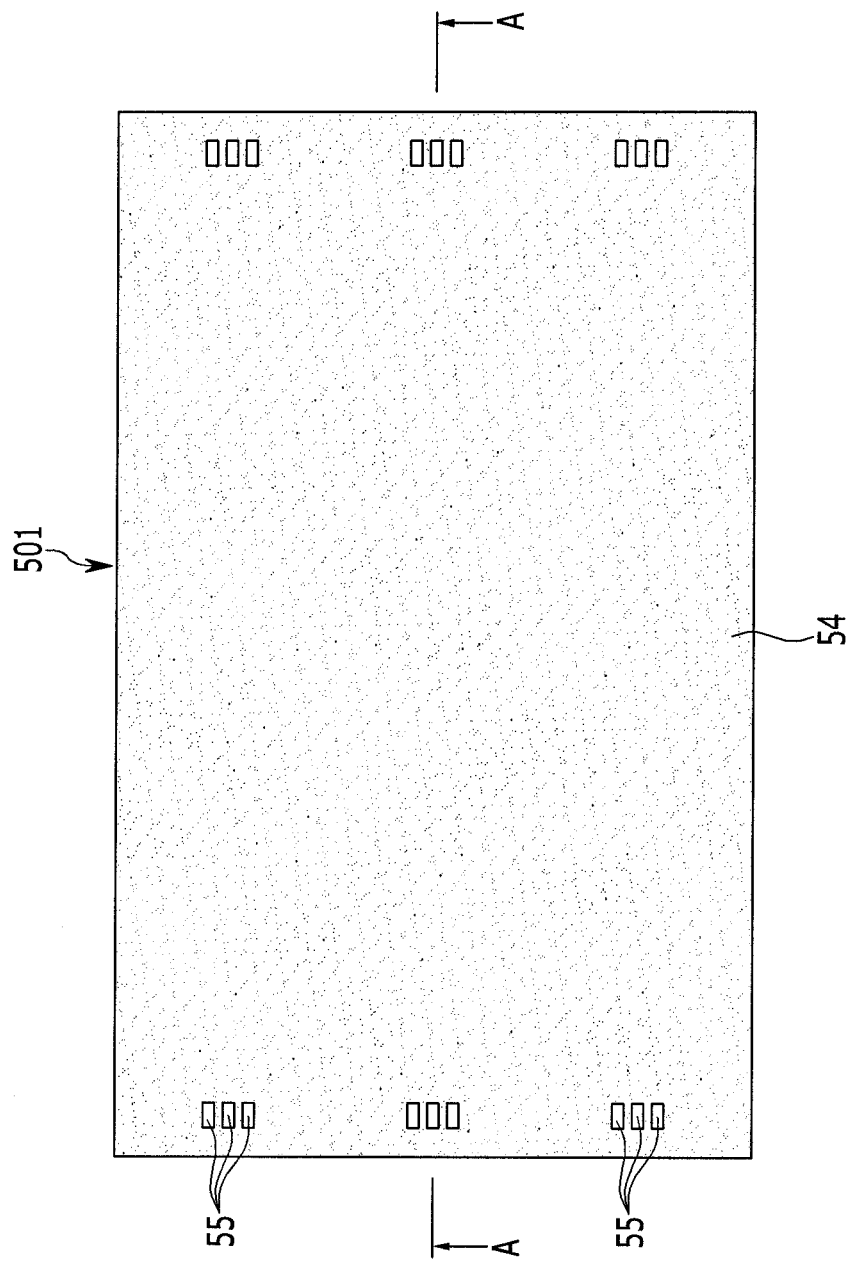
FIG. 4 is a top plan view illustrating an outer surface of a sealing substrate of an OLED display according to a second embodiment.
Figure 5:
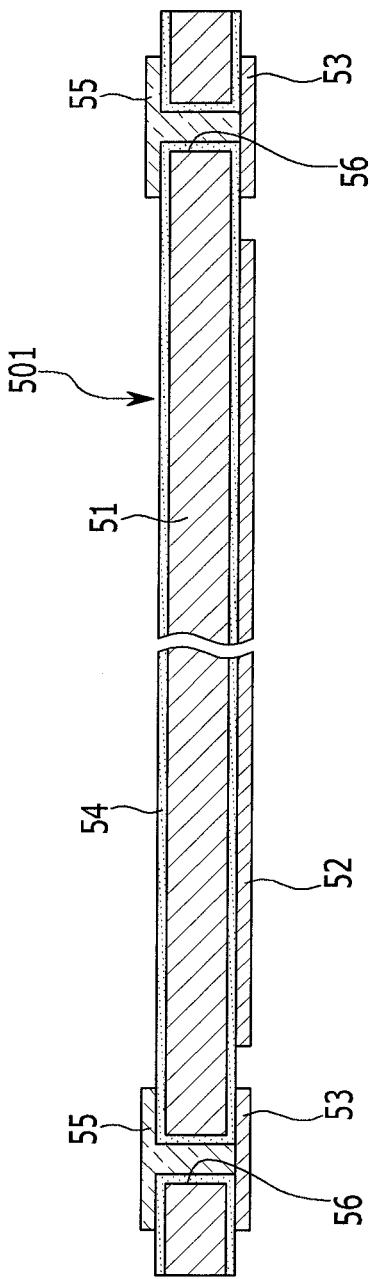
FIG. 5 is a cross-sectional view illustrating the sealing substrate taken along line A-A of FIG. 4.

FIG. 4 is a top plan view illustrating an outer surface of a sealing substrate of an OLED display according to a second embodiment, and FIG. 5 is a cross-sectional view illustrating the sealing substrate taken along line A-A of FIG. 4.

Referring to FIGS. 4 and 5, the OLED display according to the second embodiment is formed in a configuration similar to that of the OLED display according to the first embodiment except that a third metal layer 55 that is connected to the second metal layer 53 is further formed at an outer surface of the sealing substrate 501. Elements of the second embodiment use the same reference numerals as those of the first embodiment.

In some embodiments, a composite member 51 of a sealing substrate 501 forms a penetration hole 56 at a forming position of a second metal layer 53. One penetration hole 56 can be formed in each of a plurality of second metal layers 53. The third metal layer 55 is formed over an outer surface of the composite member 51 while filling the penetration hole 56 and is electrically connected to the second metal layer 53 by contacting with the second metal layer 53. The quantity of the third metal layer 55 is equal to that of the second metal layer 53, and a plurality of third metal layers 55 are positioned at a predetermined distance from each other.

In this case, an insulating layer 54 is formed directly on an inner surface of the composite member 51, a side wall of the penetration hole 56, and an outer surface of the composite member 51 to prevent the third metal layers 55 from being short-circuited from each other. In the second embodiment, by more decreasing wiring resistance of signal lines 32 of a driving driver 30, an RC delay suppressing effect can be further improved, compared with the first embodiment.

Figure 6:
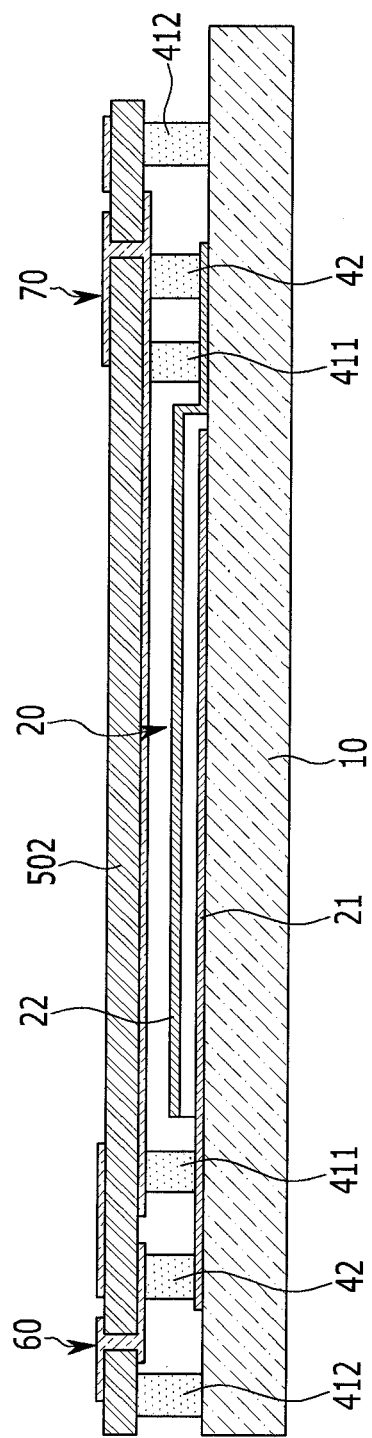
FIG. 6 is a cross-sectional view illustrating an OLED display according to a third embodiment.
Figure 7:
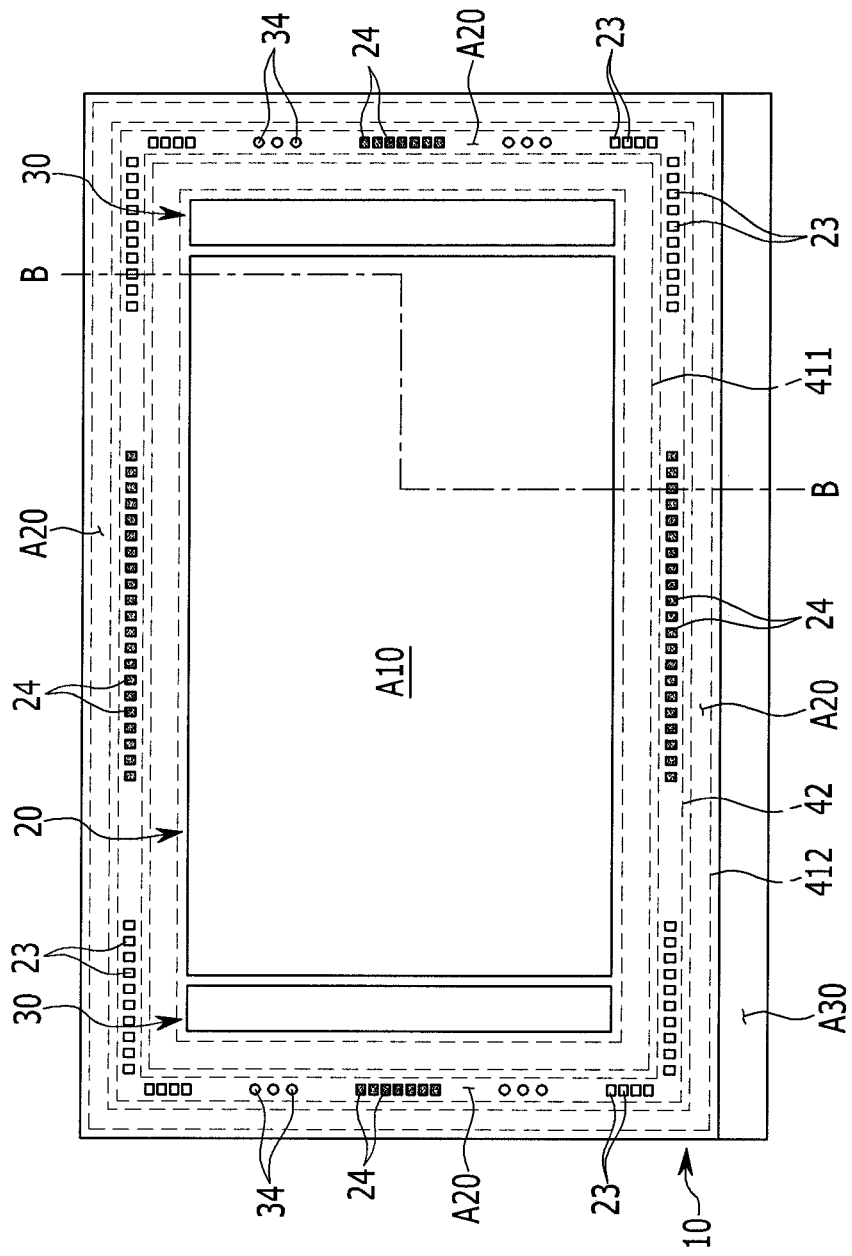
FIG. 7 is a top plan view illustrating a substrate of the OLED display that is shown in FIG. 6.

FIG. 6 is a cross-sectional view illustrating an OLED display according to a third embodiment, and FIG. 7 is a top plan view illustrating a substrate of the OLED display that is shown in FIG. 6. FIG. 6 illustrates a cross-section of the substrate taken along line B-B of FIG. 7.

Referring to FIGS. 6 and 7, an OLED display 300 according to the third embodiment has a first conductive portion 60 and a second conductive portion 70 to a sealing substrate 502 and is formed in a configuration similar to the OLED display according to the first embodiment, except for a configuration of applying an electric signal to each of a common power source line 21 and a common electrode 22 using the first conductive portion 60 and the second conductive portion 70. Elements of the third embodiment use the same reference numerals as those of the first embodiment.

FIG. 6 schematically illustrates a display unit 20 in which the common power source line 21 and the common electrode 22 are formed. A substrate 10 includes a display area A10 at which the display unit 20 is positioned and a non-display area that is positioned outside the display area A10. The non-display area is divided into a wire, a sealing area A20, and a pad area A30.

In the wire and the sealing area A20, a pad 34 (hereinafter, referred to as a 'first pad') that is connected to a signal line (not shown) of a driving driver 30, a second pad 23 that is connected to the common power source line 21 of the display unit 20, and a third pad 24 that is connected to the common electrode 22 of the display unit 20 are positioned. The second pad 23 and the third pad 24 are formed in all wires and sealing areas A20 of four locations and are alternately disposed in one direction of the substrate 10.

FIG. 7 illustrates the first pad 34 that is formed in a circle and illustrates the third pad 24 that is formed in a dot pattern in order to divide the first pad 34, the second pad 23, and the third pad 24.

The second pad 23 that is positioned at the long side of the substrate 10 among a plurality of second pads 23 is connected to a first common power source line, and the second pad 23 that is positioned at the short side of the substrate 10 is connected to a second common power source line. When a pair of driving drivers 30, for example, a scan driver is positioned at the left side and the right side of the display unit 20, the first pad 34 is positioned at the short side of the substrate 10 and is positioned between the second pad 23 and the third pad 24.

In FIG. 7, the first pad 34, the second pad 23, and the third pad 24 are schematically illustrated, and positions and the quantity thereof are not limited to the illustrated example.

The OLED display 300 according to the third embodiment includes a first bonding layer 411 that encloses the display unit 20 and the driving driver 30 and a second bonding layer 412 that encloses the first bonding layer 411 outside the first bonding layer 411. A conductive bonding layer 42 is positioned between the first bonding layer 411 and the second bonding layer 412. The conductive bonding layer 42 represents conductivity only in a thickness direction and does not represent conductivity in other directions. Therefore, even if one conductive bonding layer 42 contacts with all the first pad 34, the second pad 23, and the third pad 24, these pads are not short-circuited from each other.

Figure 8:
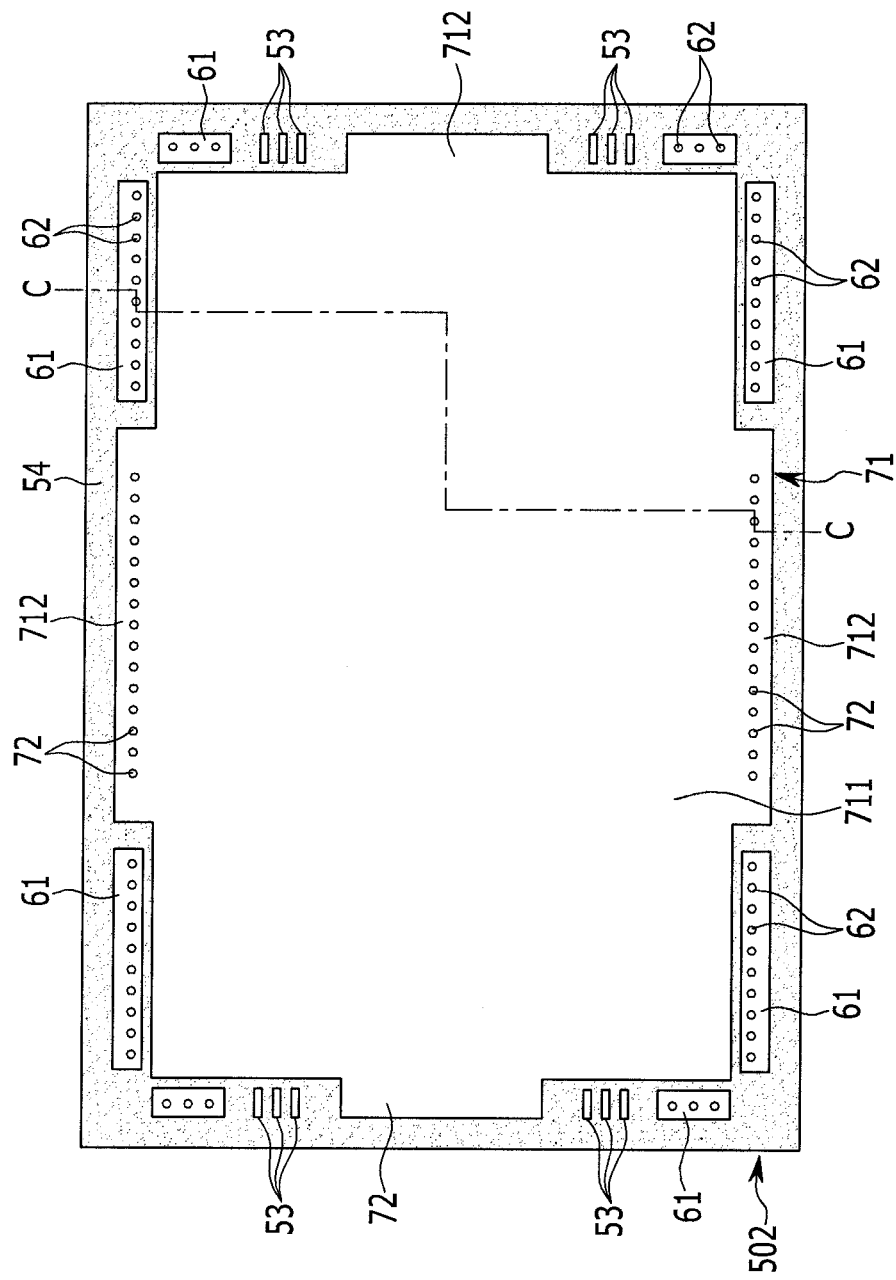
FIG. 8 is a top plan view illustrating an inner surface of a sealing substrate of the OLED display that is shown in FIG. 6.
Figure 9:
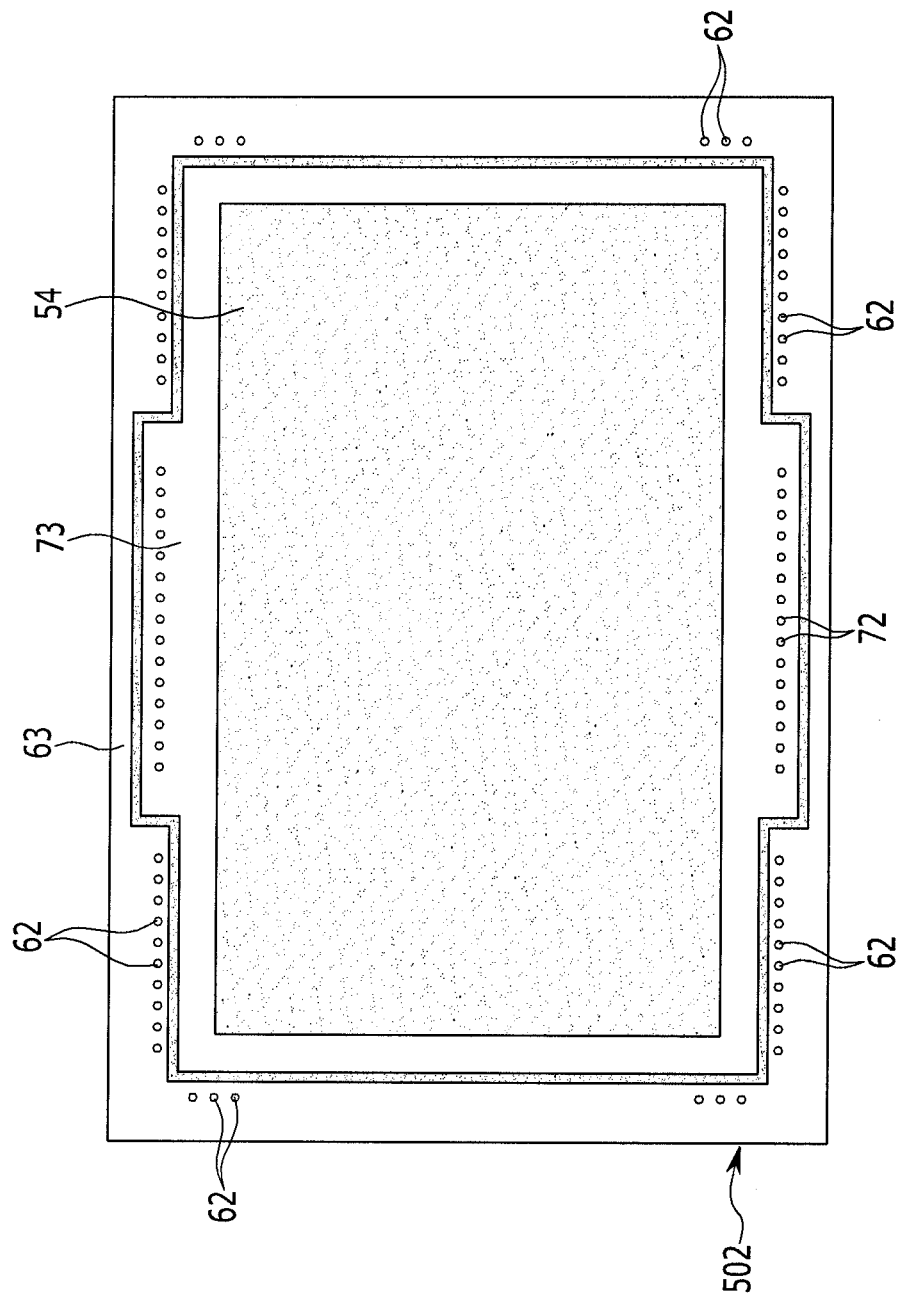
FIG. 9 is a top plan view illustrating an outer surface of a sealing substrate of the OLED display that is shown in FIG. 6.
Figure 10:
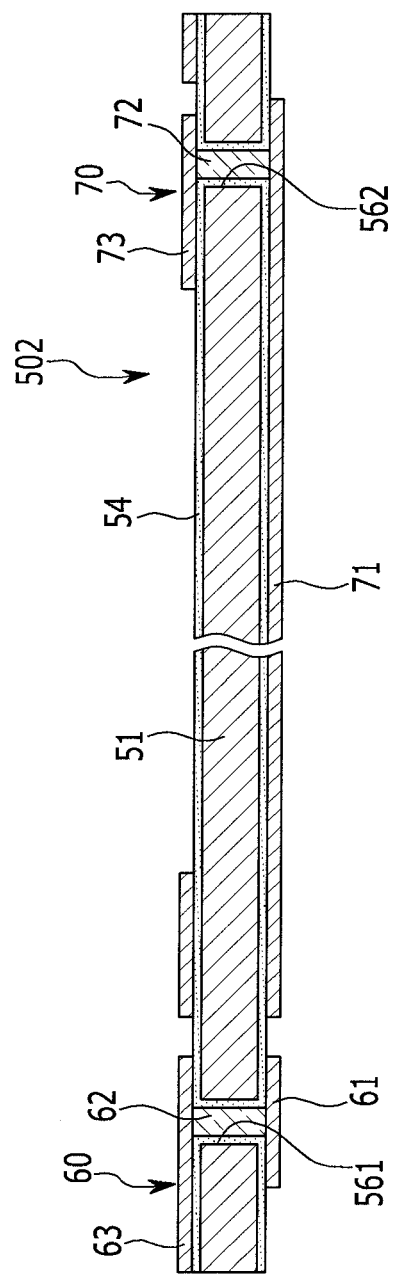
FIG. 10 is a cross-sectional view illustrating the sealing substrate taken along line C-C of FIG. 8.

FIGS. 8 and 9 are top plan views illustrating an inner surface and an outer surface of a sealing substrate of the OLED display that is shown in FIG. 6, and FIG. 10 is a cross-sectional view illustrating the sealing substrate taken along line C-C of FIG. 8.

Referring to FIGS. 8 to 10, a composite member 51 forms a first penetration hole 561 for applying a first electric signal of the common power source line 21 and a second penetration hole 562 for applying a second electric signal of the common electrode 22. A first conductive portion 60 is formed over an inner surface of the composite member 51, the first penetration hole 561, and an outer surface of the composite member 51. A second conductive portion 70 is formed over an inner surface of the composite member 51, a second penetration hole 562, and an outer surface of the composite member 51.

In this case, an insulating layer 54 is formed directly on an inner surface of the composite member 51, a side wall of the first and second penetration holes 561 and 562, and an outer surface of the composite member 51 to prevent the first conductive portion 60 and the second conductive portion 70 from being short-circuited. In FIG. 6, the insulating layer 54 is omitted.

The first conductive portion 60 includes a first inner layer 61 that is positioned at an inner surface of the composite member 51, a first connection portion 62 that contacts with the first inner layer 61 and that is filled in the first penetration hole 561, and a first outer layer 63 that contacts with the first connection portion 62 and that is positioned at the outer surface of the composite member 51. The first inner layer 61 is electrically connected to the second pad 23 on the substrate 10 by contacting with the conductive bonding layer 42.

The second conductive portion 70 includes a second inner layer 71 that is positioned at an inner surface of the composite member 51, a second connection portion 72 that contacts with the second inner layer 71 and that is filled in the second penetration hole 562, and a second outer layer 73 that contacts with the second connection portion 72 and that is positioned at an outer surface of the composite member 51. The second inner layer 71 includes a central portion 711 that is opposite to the display unit 20 and the driving driver 30, and that contacts with the first bonding layer 411. The second inner layer 71 further includes an extension portion 712 that is extended toward the edge of the composite member 51 from the central portion 711. The extension portion 712 is electrically connected to the third pad 24 on the substrate 10 by contacting with the conductive bonding layer 42.

The first inner layers 61 are positioned between the extension portions 712 of the second inner layer 71, and a metal layer 53 (equal to the second metal layer of the first embodiment) is positioned between the first inner layer 61 and the extension portion 712. The metal layer 53 is electrically connected to the first pad 34 on the substrate 10 by contacting with the conductive bonding layer 42. The metal layer 53 is positioned at a predetermined distance from the first inner layer 61 and the second inner layer 71 and is provided with the same quantity as that of the first pad 34.

The central portion 711 of the second inner layer 71 is the same member as the first metal layer 52 of the OLED display 100 that is shown in FIG. 1 and functions as metal encapsulation that blocks penetration of external moisture and oxygen. Further, the second inner layer 71 functions as a wire layer that transfers an electric signal to the common electrode 22.

The first outer layer 63 is positioned at an outer surface edge of the composite member 51, and the second outer layer 73 is positioned at a predetermined distance from the first outer layer 63 at the inside of the first outer layer 63. Both the first outer layer 63 and the second outer layer 73 can be formed in a quadrangular frame shape.

An outer connection terminal (not shown) is attached to the first outer layer 63 and the second outer layer 73. Therefore, the first outer layer 63 receives a first electric signal of the common power source line 21 from an outer connection terminal and transfers the first electric signal to the first inner layer 61. The second outer layer 73 receives a second electric signal of the common electrode 22 from the outer connection terminal and transfers the second electric signal to the second inner layer 71.

According to the above-described configuration, a corresponding electric signal can be uniformly applied to the common power source line 21 and the common electrode 22 even without forming the pad area A30 at four edges of the right side, the left side, the upper side, and the lower side of the substrate 10 while embodying a large area display unit 20. As a result, in addition to avoiding non-uniform luminance problem that may be caused when producing a large sized display unit 20, an entire structure and a manufacturing process of the OLED display 100 can be simplified.

Figure 11:
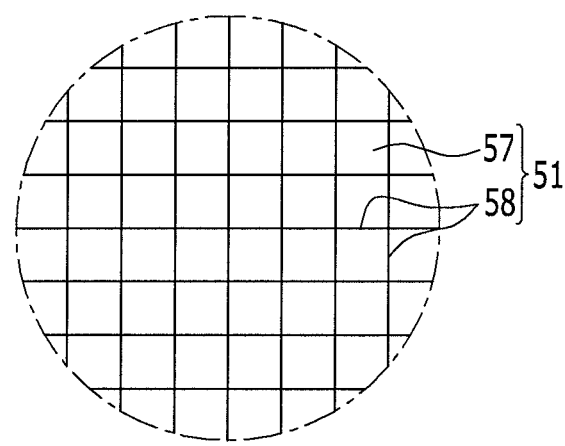
FIG. 11 is a partially enlarged top plan view illustrating a composite member of the OLED display that is shown in FIGS. 1 and 6.

FIG. 11 is a partially enlarged top plan view illustrating a composite member of the OLED display that is shown in FIGS. 1 and 6.

Referring to FIG. 11, the composite member 51 is made of a carbon fiber composite material in which a plurality of carbon fibers 58 are impregnated into a resin matrix 57. Because the carbon fiber 58 does not absorb moisture, the carbon fiber 58 enhances moisture penetration prevention ability of the composite member 51. Because the composite member 51 including the carbon fiber 58 has excellent mechanical properties, the composite member 51 can embody large rigidity with a small thickness.

A plurality of carbon fibers 58 are disposed to intersect and may have, for example, a form that is woven with a latitude fiber and a longitude fiber. FIG. 11 illustrates a case where carbon fibers 58 meet at right angles, but the present invention is not limited to the illustrated example and the carbon fibers 58 can cross even with other angles other than a right angle.

Figure 12:
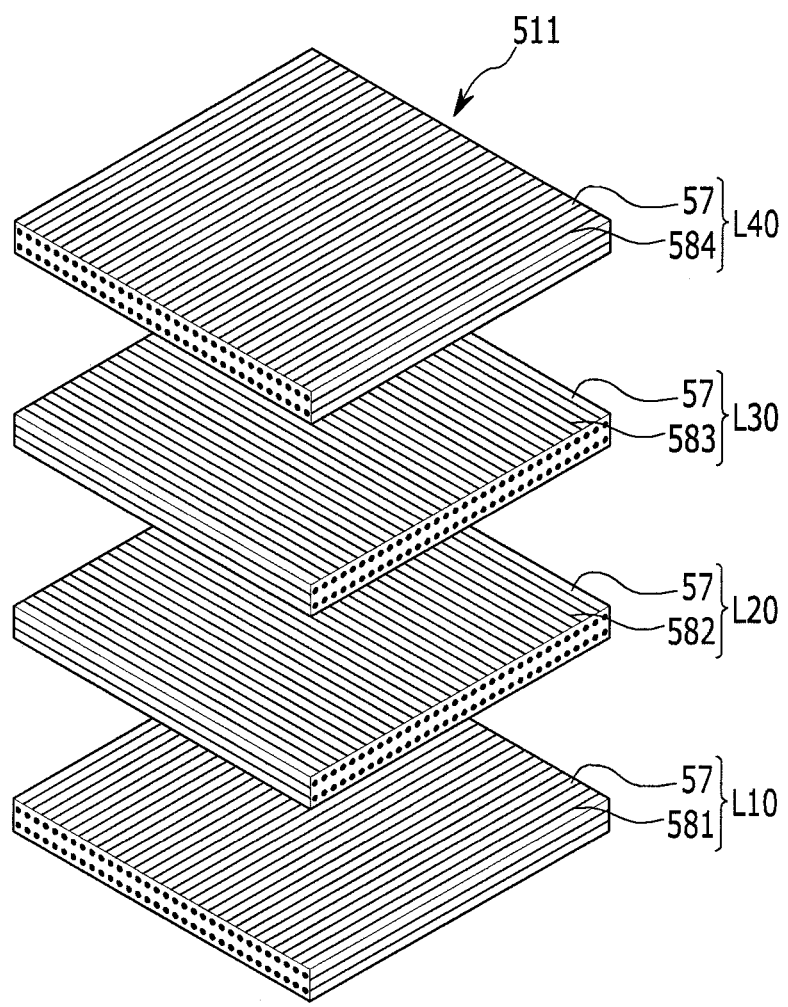
FIG. 12 illustrates a variation of FIG. 11 and is an exploded perspective view illustrating a composite member of the OLED display that is shown in FIGS. 1 and 6.

FIG. 12 illustrates an variation of FIG. 11 and is an exploded perspective view illustrating a composite member of the OLED display that is shown in FIGS. 1 and 6.

Referring to FIG. 12, a composite member 511 is formed in a stacking structure of a first layer L10, a second layer L20, a third layer L30, and a fourth layer L40, and each of the layers L10, L20, L30, and L40 includes a resin matrix 57 and a plurality of carbon fibers 581, 582, 583, and 584. The plurality of carbon fibers 581, 582, 583, and 584 are formed in a configuration that is impregnated into the resin matrix 57.

The carbon fiber 581 of the first layer L10 and the carbon fiber 584 of the fourth layer L40 are arranged in a first direction. The carbon fiber 582 of the second layer L20 and the carbon fiber 583 of the third layer L30 are arranged in a second direction. The first direction and the second direction may be orthogonal or may not be orthogonal. In FIG. 12, a configuration that the first direction and the second direction are orthogonal is illustrated as an example.

Each of the first layer L10 to the fourth layer L40 is formed with the resin matrix 57, for example, a carbon fiber prepreg in which the plurality of carbon fibers 581, 582, 583, and 584 are impregnated into an epoxy resin. The first layer L10 to the fourth layer L40 form a single composite member 511 while the resin matrix 57 is integrally cured by baking.

When the plurality of carbon fibers 581, 582, 583, and 584 are disposed in the above-described method, a horizontal direction thermal expansion coefficient and a vertical direction thermal expansion coefficient of the composite member 511 become equal. Thus it is possible to prevent the composite member 511 from being bent.

Figure 13:
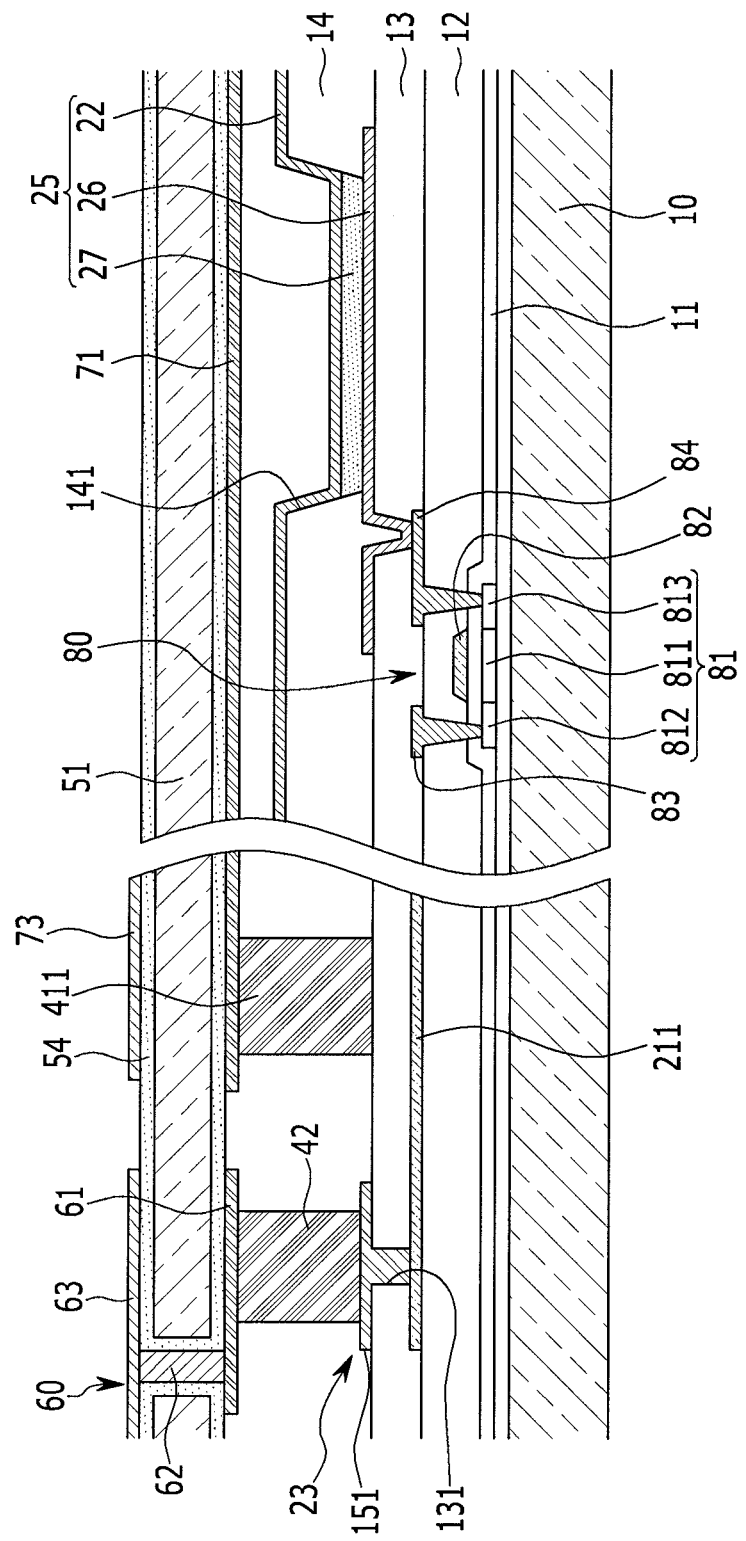
FIGS. 13 to 15 are partially enlarged cross-sectional views illustrating the OLED display that is shown in FIG. 6.
Figure 14:
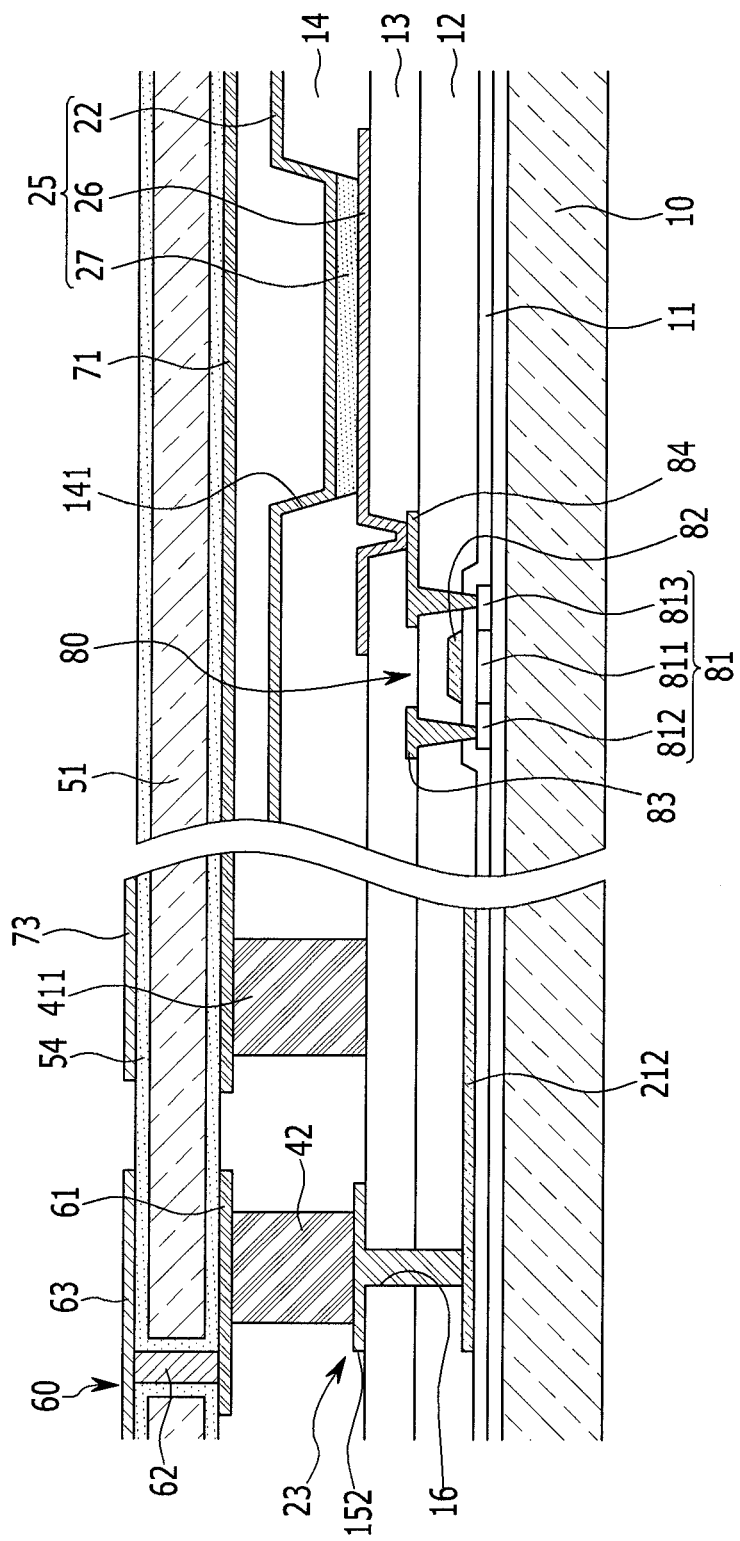
Figure 15:
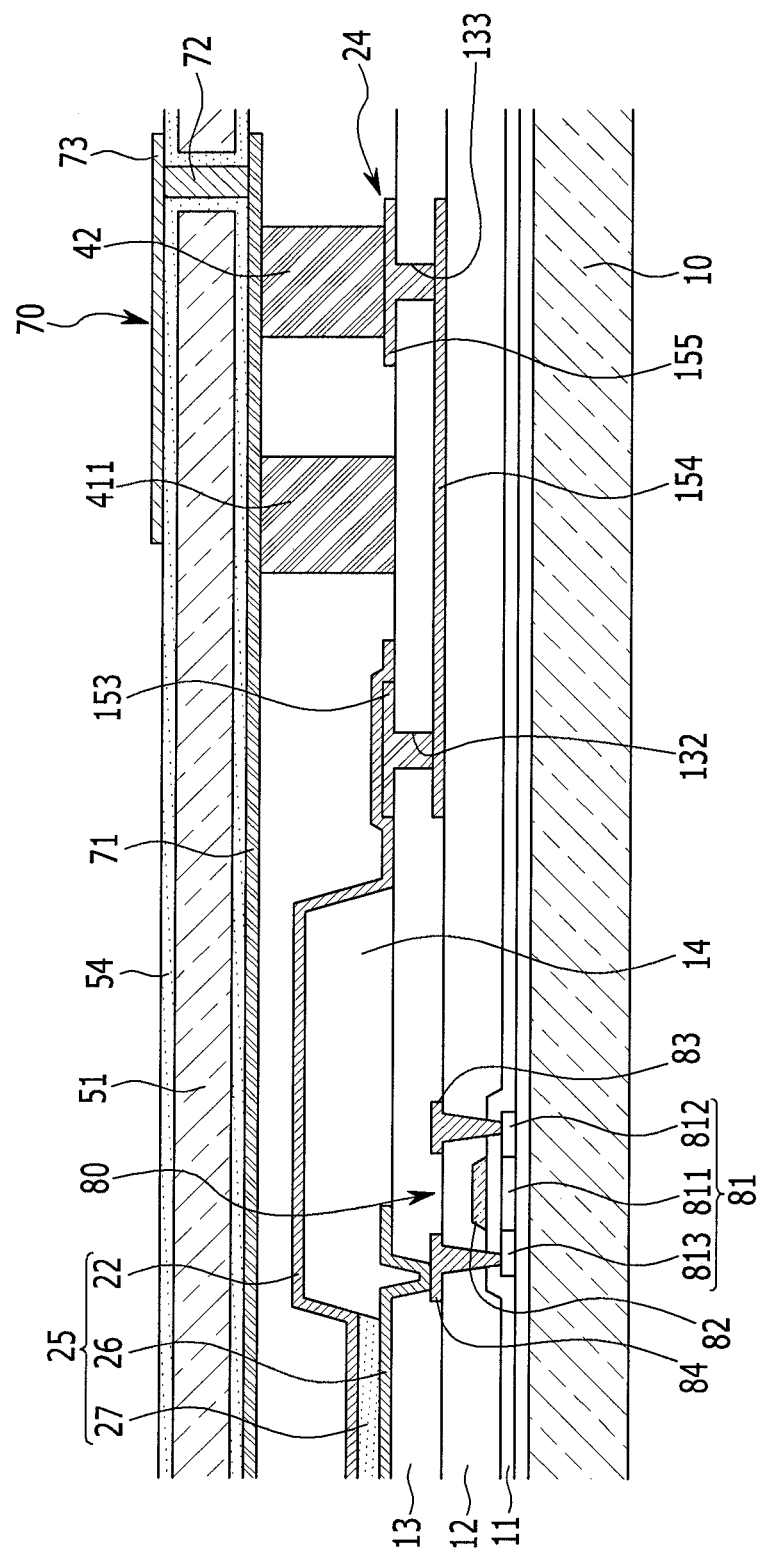

FIGS. 13 to 15 are partially enlarged cross-sectional views illustrating the OLED display that is shown in FIG. 6. FIG. 13 illustrates in detail a first common power source line and a second pad, and FIG. 14 illustrates in detail a second common power source line and a second pad. FIG. 15 illustrates in detail a common electrode and a third pad.

Referring to FIGS. 13 to 15, an organic light emitting element 25 and a driving circuit are formed in each pixel of the display unit. The driving circuit is formed with at least two thin film transistors and at least one capacitor. FIGS. 13 to 15 schematically illustrate that one thin film transistor 80 and one organic light emitting element 25 are positioned at a display unit.

In some embodiments, the thin film transistor 80 includes a semiconductor layer 81, a gate electrode 82, a source electrode 83, and a drain electrode 84. The semiconductor layer 81 is formed with a polysilicon film and includes a channel area 811, a source area 812, and a drain area 813. The channel area 811 is an intrinsic semiconductor in which impurities are not doped, and the source area 812 and the drain area 813 are an impurity semiconductor in which impurities are doped.

The gate electrode 82 is positioned on the channel area 811 of the semiconductor layer 81 with a gate insulating layer 11 interposed therebetween. The source electrode 83 and the drain electrode 84 are positioned on the gate electrode 82 with an interlayer insulating layer 12 interposed therebetween and are connected to the source area 812 and the drain area 813, respectively, through a contact hole that is formed in the interlayer insulating layer 12.

A planarization layer 13 is formed on the source electrode 83 and the drain electrode 84, and a pixel electrode 26 is positioned on the planarization layer 13. The pixel electrode 26 is connected to the drain electrode 84 through a contact hole of the planarization layer 13.

A pixel defining layer 14 is positioned on the pixel electrode 26 and the planarization layer 13. The pixel defining layer 14 exposes a part of the pixel electrode 26 by forming a first opening 141 in each pixel. An organic emission layer 27 is formed on the exposed pixel electrode 26, and in order to cover the organic emission layer 27 and the pixel defining layer 14, a common electrode 22 is formed in an entire display unit. The pixel electrode 26, the organic emission layer 27, and the common electrode 22 constitute an organic light emitting element 25.

The pixel electrode 26 may be a hole injection electrode, and the common electrode 22 may be an electron injection electrode. In this embodiment, the organic emission layer 27 is formed with a hole injection layer (HIL), a hole transport layer (HTL), an emission layer, an electron transport layer (ETL), and an electron injection layer (EIL) that are sequentially stacked from the pixel electrode 26. When holes and electrons are injected from the pixel electrode 26 and the common electrode 22 into the organic emission layer 27 and excitons in which the injected holes and electrons are coupled drop from an exited state to a ground state, light is emitted.

The pixel electrode 26 is formed with a transmissive conductive layer, and the common electrode 22 is formed with a reflective conductive layer. Light that is emitted from the organic emission layer 27 is reflected by the common electrode 22 and is emitted to the outside via the pixel electrode 26 and the substrate 10. Such a light emitting structure is called a rear emission type. The pixel electrode 26 may be formed in a triple film of ITO/silver (Ag)/ITO, and the common electrode 22 may include silver (Ag) or aluminum (Al).

A first common power source line 211 and a second common power source line 212 can be formed in the same layer as that of one electrode of the source/drain electrode 83 and 84 and the gate electrode 82. FIG. 13 illustrates a case where the first common power source line 211 is formed with such a material in the same layer as that of the source/drain electrodes 83 and 84, and FIG. 14 illustrates a case where the second common power source line 212 is formed with such a material in the same layer as that of the gate electrode 82.

Referring to FIGS. 13 and 14, end portions of the first common power source line 211 and the second common power source line 212 are extended to the outside of the display unit. At least one of four insulating layers that are formed in the display unit is extended to the outside of the display unit. For example, an end portion of the first common power source line 211 may be covered by the planarization layer 13, and an end portion of the second common power source line 212 may be covered by the interlayer insulating layer 12 and the planarization layer 13.

The planarization layer 13 exposes an end portion of the first common power source line 211 by forming a second opening 131, and a first pad conductive layer 151 is formed on the planarization layer 13 to be electrically connected to the first common power source line 211 through the second opening 131. A second pad 23 that is positioned at the long side of the substrate 10 can be defined as the first pad conductive layer 151.

The interlayer insulating layer 12 and the planarization layer 13 expose an end portion of the second common power source line 212 by forming a third opening 16, and a second pad conductive layer 152 is formed on the planarization layer 13 to be electrically connected to the second common power source line 212 through the third opening 16. The second pad 23 that is positioned at the short side of the substrate 10 can be defined as the second pad conductive layer 152. The first pad conductive layer 151 and the second pad conductive layer 152 can be formed with such a material in the same layer as that of the pixel electrode 26.

Referring to FIG. 15, the common electrode 22 is positioned at the inside of the first bonding layer 411, and the third pad 24 is formed over the inside and the outside of the first bonding layer 411 to electrically connect the common electrode 22 and the conductive bonding layer 42. The third pad 24 includes a third pad conductive layer 153, a fourth pad conductive layer 154, and a fifth pad conductive layer 155.

The third pad conductive layer 153 is positioned at the inside of the first bonding layer 411 and contacts with the common electrode 22. The fourth pad conductive layer 154 is connected to the third pad conductive layer 153 through a fourth opening 132 of the planarization layer 13 and is positioned over the inside and the outside of the first bonding layer 411. The fifth pad conductive layer 155 is positioned between the conductive bonding layer 42 and the planarization layer 13 and is connected to the fourth pad conductive layer 154 through a fifth opening 133 of the planarization layer 13.

The third pad conductive layer 153 and the fifth pad conductive layer 155 can be formed with such a material in the same layer as that of the pixel electrode 26. The fourth pad conductive layer 154 can be formed with such a material in the same layer as that of one electrode of the gate electrode 82 and the source/drain electrode 83 and 84. In FIG. 15, a configuration that the fourth pad conductive layer 154 is formed in the same layer as that of the source/drain electrode 83 and 84 is illustrated as an example.

A detailed structure of the third pad 24 is not limited to the illustrated example, and any configuration that can allow electric conduction of the common electrode 22 of the display unit and the conductive bonding layer 42 of the outside of the display unit can be applied.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

<Description of symbols>

| | |
|---|---|
| 100, 300: organic light emitting diode (OLED) display | |
| 10: substrate | |
| 20: display unit | 21: common power source line |
| 22: common electrode | 23: second pad |
| 24: third pad | 25: organic light emitting element |
| 26: pixel electrode | 27: organic emission layer |
| 30: driving driver | 32: signal line |
| 33: extension wire | 34: pad, first pad |
| 41: bonding layer | 42: conductive bonding layer |
| 50: sealing substrate | 51: composite member |
| 52: first metal layer | 53: second metal layer |
| 54: insulating layer | 55: third metal layer |
| 60: first conductive portion | 70: second conductive portion |

What is claimed is:

1. A display device comprising:
a base substrate comprising an inner surface and an outer surface;
a display unit disposed over the inner surface of the base substrate;
a driving driver disposed over the inner surface of the base substrate, the driving driver comprising a plurality of signal lines;
a sealing substrate comprising an inner surface, which opposes the inner surface of the base substrate, thereby defining a space interposed between the base substrate and the sealing substrate, wherein the sealing substrate comprises a composite member comprising a resin matrix and a plurality of carbon fibers, and a first metal layer disposed over the composite member;
a bonding layer interposed between the base substrate and the sealing substrate and surrounding the display unit and the driving driver, whereby the bonding layer divides the space into an enclosed space and a peripheral space when viewing in a thickness direction of the display;
a plurality of pads disposed over the inner surface of the base substrate and in the peripheral space when viewing in the thickness direction, the plurality of pads being electrically connected to the plurality of signal lines;
a plurality of second metal layers disposed over the inner surface of the sealing substrate and in the peripheral space when viewing in the thickness direction; and
a conductive connecting layer interposed and electrically connecting between the plurality of pads and plurality of second metal layers and disposed in the peripheral space when viewing in the thickness direction.

2. The display device of claim 1, further comprising an insulating layer disposed between the composite member and the first metal layer, and between the composite member and the plurality of second metal layers.

3. The display device of claim 1, further comprising a plurality of extension wires connecting the plurality of pads and the plurality of signal lines and spaced from each other, and wherein one of the plurality of pads is disposed at an end portion of each extension wire.

4. The display device of claim 3, wherein the number of the plurality of second metal layers equals to that of the plurality of pads, and wherein each of the plurality of second metal layers is disposed at a position to overlap with a corresponding pad when viewing in the thickness direction.

5. The display device of claim 4, wherein the conductive connecting layer is electrically conductive in the thickness direction, and is electrically non-conductive in a direction other than the thickness direction.

6. The display device of claim 4, wherein the composite member comprises an inner surface facing the base substrate, an outer surface opposing the inner surface and a plurality of through holes,
wherein a plurality of third metal layers are disposed over the outer surface of the composite member, and
wherein each of the plurality of second metal layers electrically connected to one of the plurality of third metal layers via one of the plurality of through holes.

7. The display device of claim 6, further comprising an insulating layer that is formed directly on the inner surface of the composite member, a side wall of the through hole, and the outer surface of the composite member.

8. The display device of claim 1, wherein the first metal layer opposes to the display unit and the driving driver, and wherein a portion of the first metal layer is disposed between the bonding layer and the sealing substrate, and
wherein the plurality of second metal layers are spaced from the first metal layer.

9. The display device of claim 8, wherein the first metal layer and the plurality of second metal layers are formed with at least one selected from the group consisting of a copper film, an aluminum film, copper foil, and aluminum foil.

10. The display device of claim 1, wherein the driving driver comprises a scan driver and is disposed at both sides of the display unit when viewing in the thickness direction.

11. An organic light emitting diode (OLED) display comprising:
a substrate;
a display unit disposed over the substrate, the display unit comprising a common power source line and a common electrode;
a driving driver disposed over the substrate and outside the display unit, the driving driver comprising a plurality of signal lines;
a sealing substrate fixed to the substrate by a bonding layer surrounding the display unit and the driving driver, wherein the sealing substrate comprises a resin matrix and a plurality of carbon fibers, and has a penetration hole;

a plurality of first pads disposed over the substrate and outside the bonding layer and electrically connected to the plurality of signal lines, respectively;

a plurality of metal layers disposed over a surface of the sealing substrate facing the plurality of pads and electrically connected to the plurality of first pads, respectively, through a conductive bonding layer; and a conductive portion disposed over an inner surface and an outer surface of the sealing substrate through the penetration hole, wherein the conductive portion is configured to supply an electric signal to one of the common power source line and the common electrode.

12. The OLED display of claim 11, further comprising a plurality of extension wires connecting the plurality of first pads and the plurality of signal lines and spaced from each other at a predetermined distance in a length direction of each signal line of the plurality of signal lines, and wherein one of the plurality of first pads is disposed at an end portion of each extension wire.

13. The OLED display of claim 12, wherein the number of the plurality of metal layers equals to that of the plurality of first pads, and wherein each of the plurality of metal layers is disposed at a position to overlap with a corresponding first pad when viewed in a thickness direction of the substrate.

14. The OLED display of claim 13, wherein the conductive bonding layer is electrically conductive in the thickness direction, and is electrically non-conductive in a direction other than the thickness direction.

15. The OLED display of claim 11, wherein the driving driver comprises a scan driver and is positioned at both sides of the display unit.

16. The OLED display of claim 11, wherein the sealing substrate comprises a first penetration hole and a second penetration hole, and wherein the conductive portion comprises:

a first conductive portion disposed over an inner surface and an outer surface of the sealing substrate and extending through the first penetration hole, wherein the first conductive portion is configured to supply a first electric signal to the common power source line; and a second conductive portion disposed over an inner surface and an outer surface of the sealing substrate and extending through the second penetration hole, wherein the second conductive portion is configured to supply a second electric signal to the common electrode.

17. The OLED display of claim 16, further comprising a plurality of second pads connecting to the common power source line, and a plurality of third pads connecting to the common electrode, wherein the second pads and third pads are disposed outside the bonding layer, wherein the conductive bonding layer is positioned between the plurality of second pads and the first conductive portion, and between the plurality of third pads and the second conductive portion.

18. The OLED display of claim 17, wherein the first conductive portion comprises:

a first inner layer disposed at an inner surface of the sealing substrate and contacting with the conductive bonding layer;

a first connection portion contacting with the first inner layer, wherein the first connection portion is filled in the first penetration hole; and a first outer layer contacting with the first connection portion and disposed at an outer surface of the sealing substrate.

19. The OLED display of claim 18, wherein the second conductive portion comprises:

a second inner layer disposed at an inner surface of the sealing substrate and contacting with the conductive bonding layer;

a second connection portion contacting with the second inner layer, wherein the second connection portion is filled in the second penetration hole; and a second outer layer contacting with the second connection portion and disposed at an outer surface of the sealing substrate.

20. The OLED display of claim 19, further comprising an insulating layer that is formed over an inner surface of the sealing substrate, a side wall of the first penetration hole and the second penetration hole, and directly on an outer surface of the sealing substrate.

21. The OLED display of claim 19, wherein the second inner layer comprises a central portion facing to the display unit and the driving driver and contacting with the bonding layer, and a plurality of extensions contacting with the conductive bonding layer.

22. The OLED display of claim 21, wherein the first inner layer and the plurality of metal layers are disposed at a predetermined distance from the central portion and outside the central portion.

23. The OLED display of claim 11, wherein the plurality of carbon fibers are arranged to intersect each other within the resin matrix.

24. The OLED display of claim 11, wherein the sealing substrate has a plurality of layers, and each of the plurality of layers comprises a plurality of carbon fibers arranged in one direction and the resin matrix, and wherein an extending direction of a plurality of carbon fibers arranged in one layer of the plurality of layers and an extending direction of a plurality of carbon fibers arranged in another layer thereof intersect each other.

* * * * *